United States Patent
Chen et al.

(10) Patent No.: US 9,033,645 B2
(45) Date of Patent: May 19, 2015

(54) LIQUID CRYSTAL PANEL TRANSPORTATION DEVICE AND SUPPORT ARM STRUCTURE WITH ROTATABLE ANCILLARY ARM SECTIONS

(75) Inventors: Zenghong Chen, Shenzhen (CN); Chunhao Wu, Shenzhen (CN); Kunhsien Lin, Shenzhen (CN); Minghu Qi, Shenzhen (CN); Zhenhua Guo, Shenzhen (CN); Yunshao Jiang, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 13/635,435

(22) PCT Filed: Aug. 6, 2012

(86) PCT No.: PCT/CN2012/079730
§ 371 (c)(1),
(2), (4) Date: Feb. 27, 2013

(87) PCT Pub. No.: WO2014/019244
PCT Pub. Date: Feb. 6, 2014

(65) Prior Publication Data
US 2014/0033852 A1    Feb. 6, 2014

(30) Foreign Application Priority Data
Jul. 31, 2012  (CN) .......................... 2012 1 0267291

(51) Int. Cl.
*B25J 18/02* (2006.01)
*B65G 49/06* (2006.01)
*H01L 21/677* (2006.01)

(52) U.S. Cl.
CPC ............... *B25J 18/02* (2013.01); *Y10S 901/27* (2013.01); *Y10T 74/20329* (2015.01); *B65G 49/061* (2013.01); *B65G 49/068* (2013.01); *H01L 21/67766* (2013.01); *B65G 2249/04* (2013.01)

(58) Field of Classification Search
CPC ............... H01L 21/67742; H01L 21/67766; H01L 21/68707; H01L 21/6838; B65G 49/067; B65G 61/00; B65G 47/14; B65G 47/28; B65G 49/066; B65G 47/1457; B65G 49/064; B65G 69/16; B65G 1/133; B23Q 1/5462; B25J 9/1623; B25J 17/0216; B25J 17/0266; B25J 9/106; B25J 18/02
USPC ............. 414/744.6, 744.8, 737, 752.1, 744.1, 414/941; 901/40, 27, 28; 294/213
See application file for complete search history.

(56) References Cited

U.S. PATENT DOCUMENTS 5,833,288 A  * 11/1998 Itasaka .......................... 414/941
7,547,175 B2 *  6/2009 Chinbe et al. ............ 414/416.03
(Continued)

FOREIGN PATENT DOCUMENTS

JP  2011156654 A  *  8/2011
JP  2012216573 A  * 11/2012

*Primary Examiner* — Gerald McClain
(74) *Attorney, Agent, or Firm* — Andrew C. Cheng

(57) ABSTRACT

Source support arm of a liquid crystal panel transportation device is provided, which includes a primary arm section. The primary arm section includes a plurality of ancillary arm sections that are rotatable to open mounted thereon. A liquid crystal panel transportation device is also disclosed, which includes a support arm having a primary arm section and ancillary arm sections that are mounted to the primary arm section and are rotatable to open.

7 Claims, 4 Drawing Sheets

(56) References Cited

U.S. PATENT DOCUMENTS

2010/0034621 A1* 2/2010 Martin et al. .............. 414/217.1
2011/0284709 A1* 11/2011 Potter ........................ 248/316.1
2012/0107081 A1* 5/2012 Furuta et al. ............... 414/752.1

* cited by examiner

LIQUID CRYSTAL PANEL TRANSPORTATION DEVICE AND SUPPORT ARM STRUCTURE WITH ROTATABLE ANCILLARY ARM SECTIONS

CROSS REFERENCE TO RELATED APPLICATIONS

This application claims the priority of Chinese Patent Application No. 201210267291.1 filed on Jul. 31, 2012, the disclosure of which is incorporated herein by reference in its entirety.

BACKGROUND OF THE INVENTION

1. Field of the Invention

The present invention relates to the field of automatic transportation device applied to the manufacturing of liquid crystal panel, and in particular to a liquid crystal panel transportation device and a support arm structure thereof.

2. The Related Arts

The increasingly progress of liquid crystal displaying technology makes liquid crystal screens a commonly used display screen in the daily living of people. A liquid crystal panel is an important component of the liquid crystal screen.

Referring to FIG. 7, in a manufacture process of liquid crystal panel, a robot arm of a transportation device is commonly used to move a liquid crystal panel 7 to a rack 9 that holds liquid crystal panels therein.

As shown in FIGS. 5 and 6, a conventional liquid crystal panel transportation device uses support surfaces of support arms 8 to support a liquid crystal panel 7. A power device is then actuated to move the support arms 8 in order to eventually move the liquid crystal panel 7 to the rack 9. The structure of the liquid crystal panel transportation device has the following drawbacks:

The liquid crystal panel 7 has a small thickness but has a size that is greater than the surface area of the support surfaces. Particularly, array substrates and color filter substrates beyond generation 4.5, the thickness is even smaller and the size is much greater than the liquid crystal panels below generation 4.5. In other words, in a transportation process, edges of the liquid crystal panel 7 may easily get deformed due to gravity. Thus, in the process that the support arms 8 are moving a liquid crystal panel 7 to the rack 9, the edges of the liquid crystal panel 7 that are deflected downward may easily impact the rack 9 so as to make the edges of the liquid crystal panel 7 broken.

Further, the transportation device, as well as peripheral devices thereof, is easily subjected to vibration during the operation thereof. The vibration will be transmitted to the liquid crystal panel, making it even easier for the above described impact to occur in the liquid crystal panel, leading to failure of the entire liquid crystal panel and lowering yield rate.

SUMMARY OF THE INVENTION

The technical issue to be addressed by the present invention is to provide a liquid crystal panel transportation device and a support arm structure that effectively control deflections at opposite edges of a liquid crystal panel during the transportation of the liquid crystal panel so as to allow the transportation device to be applied to transportation of liquid crystal panel of various sizes without change of support arms thereby further reducing the cost and improving throughputs.

The technical solution of the present invention is as follows:

A support arm of liquid crystal panel transportation device comprises: a primary arm section and a plurality of ancillary arm sections that are mounted on the primary arm section and are rotatable to open mounted thereon, Preferably, the primary arm section comprises at least two parallel support bars. The support bars have top surfaces that are on the same plane.

Preferably, the plurality of ancillary arm sections each have an end connected to the support bars. The plurality of ancillary arm sections each having an opposite end that is rotatable toward an outer side of the at least two support bars for opening and closing.

Preferably, the ancillary arm sections are symmetrically arranged on the support bars.

Preferably, the support bars have side edges forming cavities for receiving the plurality of ancillary arm sections. The ancillary arm sections are received in the cavities in a closed state thereof with respect to the primary arm section.

Preferably, the ancillary arm sections have top surfaces that are on the same plane as the top surfaces of the primary arm section.

Preferably, the ancillary arm sections are stacked on the top surfaces of the support bars in a closed state with respect to the primary arm section.

Preferably, the ancillary arm sections have top surfaces on which suction nozzles for tight engagement with the liquid crystal panel are mounted.

Preferably, the ancillary arm sections are rotatable with respect to the primary arm section by a maximum angle of 90°.

The present invention also discloses a liquid crystal panel transportation device.

The present invention provides a liquid crystal panel transportation device and a support arm structure thereof, which provide the following efficacies. A plurality of ancillary arm sections that is rotatable to open on a primary arm section so as to enlarge the carrying surface of the liquid crystal panel transportation device and effectively control the deflections of the opposite edge of the liquid crystal panel during the transportation of the liquid crystal panel thereby preventing edge breaking of the liquid crystal panel resulting from impact occurring between the liquid crystal panel and a rack and effectively improving the yield rate of the liquid crystal panel. The transportation device is applicable to the transportation of liquid crystal panels of various sizes without replacing the support arm so that the cost can be further reduced and the throughput can be further increased.

DETAILED DESCRIPTION OF THE PREFERRED EMBODIMENTS

A description will be given to a preferred embodiment of the present invention with reference to the attached drawings.

An embodiment of the present invention provides a support arm structure for a liquid crystal panel transportation device, which comprise a primary arm section 1 on which a plurality of ancillary arm sections 2 that are rotatable to open is mounted.

The liquid crystal panel transportation device is a device that uses the support arm thereof to move a liquid crystal panel 4 to a rack 5 on which the liquid crystal panel is stored.

Figure 4:
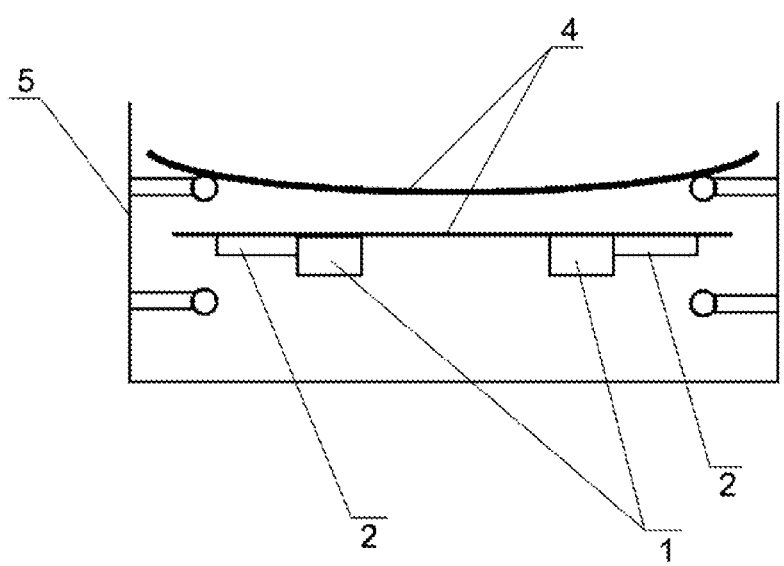
FIG. 4 is a schematic cross-sectional view showing the liquid crystal panel transportation device according to the embodiment of the present invention moving a liquid crystal panel to a rack.
Figure 5:
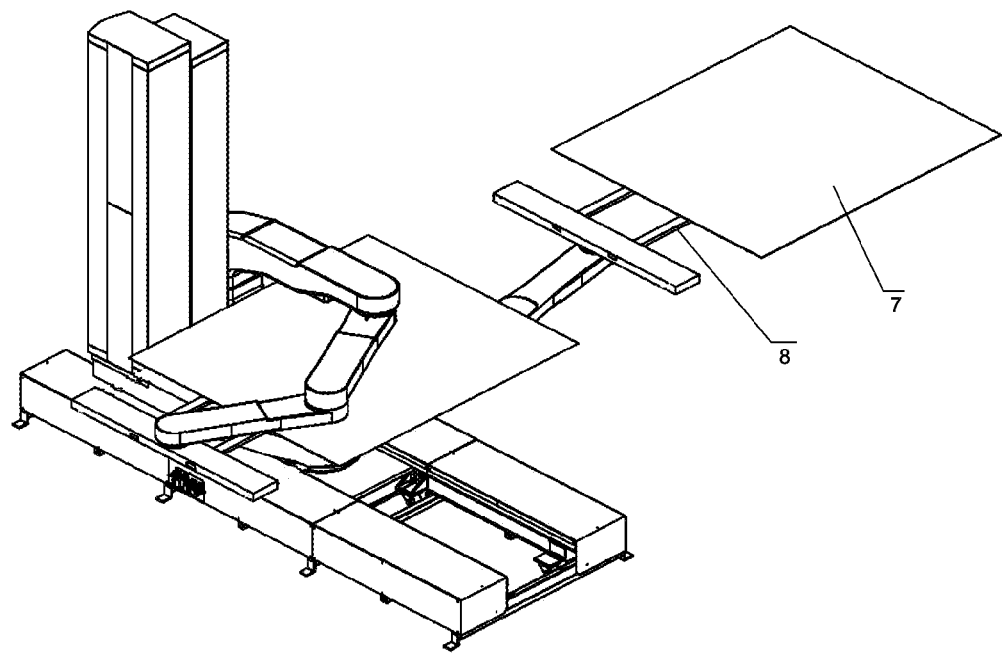
FIG. 5 is a perspective view showing a conventional liquid crystal panel transportation device.
Figure 6:
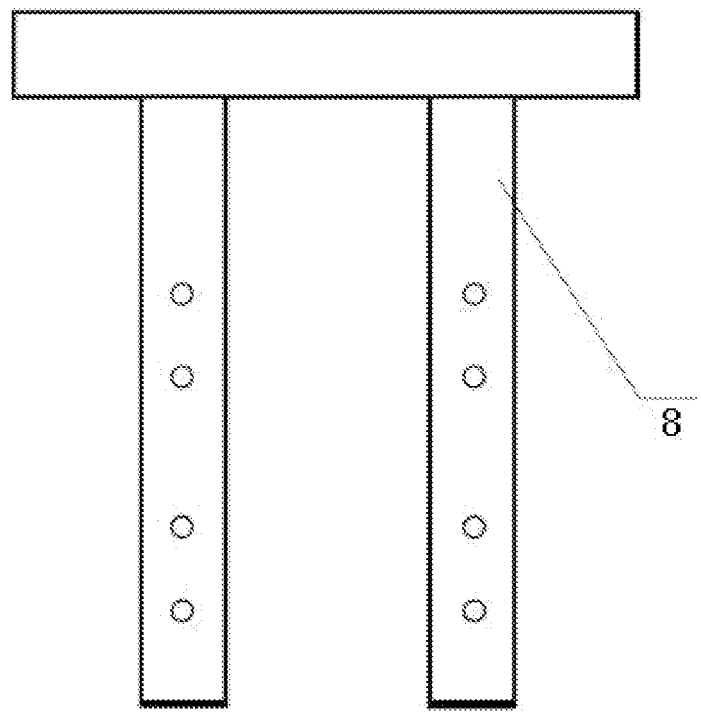
FIG. 6 is a plan view of a support arm of the conventional liquid crystal panel transportation device.
Figure 7:
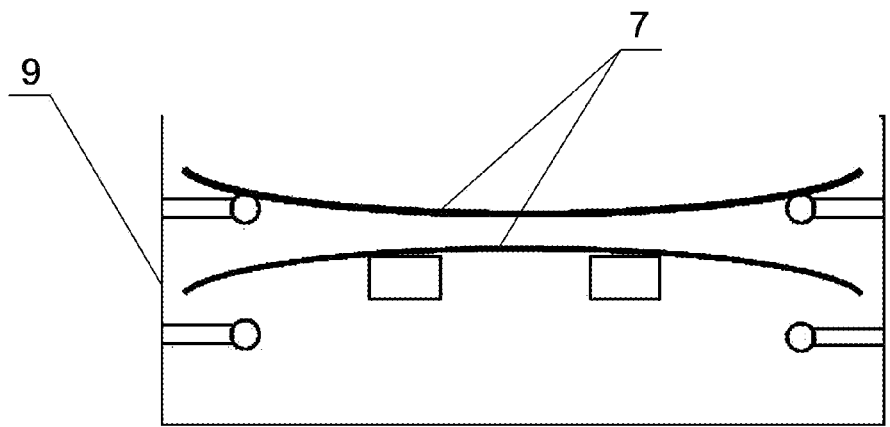
FIG. 7 is a schematic view showing the conventional liquid crystal panel transportation device moving a liquid crystal panel to a rack.

To practice, as shown in FIG. 4, the purpose of mounting the plurality of ancillary arm sections 2 that are rotatable to open is to make the transportation device applicable to the transportation of liquid crystal panels of various sizes. For example, when the ancillary arm sections 2 are opened, a carrying area of the support arm is increased to help reducing edge deflection of the liquid crystal panel carried thereon, making it not susceptible to contact with the rack 5 that might lead to edge breaking of the liquid crystal panel 4.

To carry a panel of a small size, the ancillary arm sections 2 are rotated to retract back and stowed on the primary arm section 1. This saves space and also saves the time for replacing the support arm thereby further improving transportation efficiency.

The embodiments that the primary arm section 1 is coupled to the ancillary arm sections 2 will be described.

Figure 1:
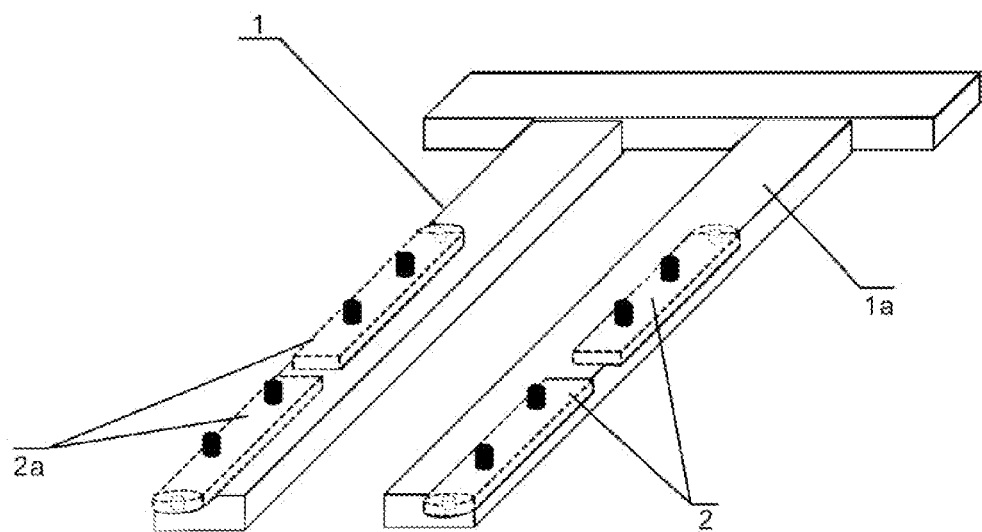
FIG. 1 is a perspective view showing a support arm of a liquid crystal panel transportation device according to an embodiment of the present invention.
Figure 2:
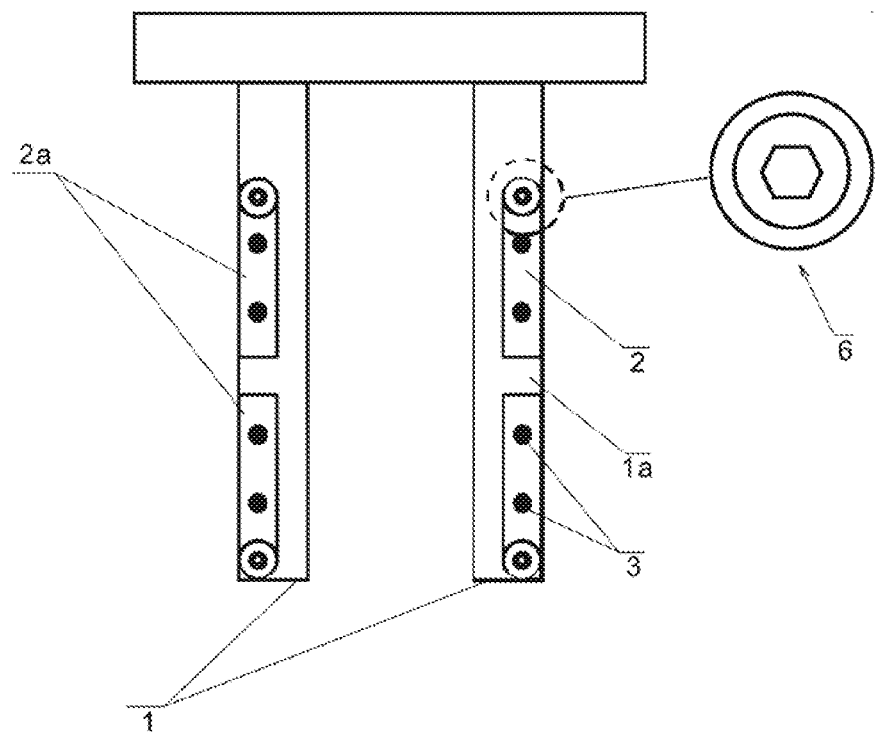
FIG. 2 is a top plan view showing the support arm of the liquid crystal panel transportation device according to the embodiment of the present invention in a condition where ancillary arm sections are set in a retracted state.
Figure 3:
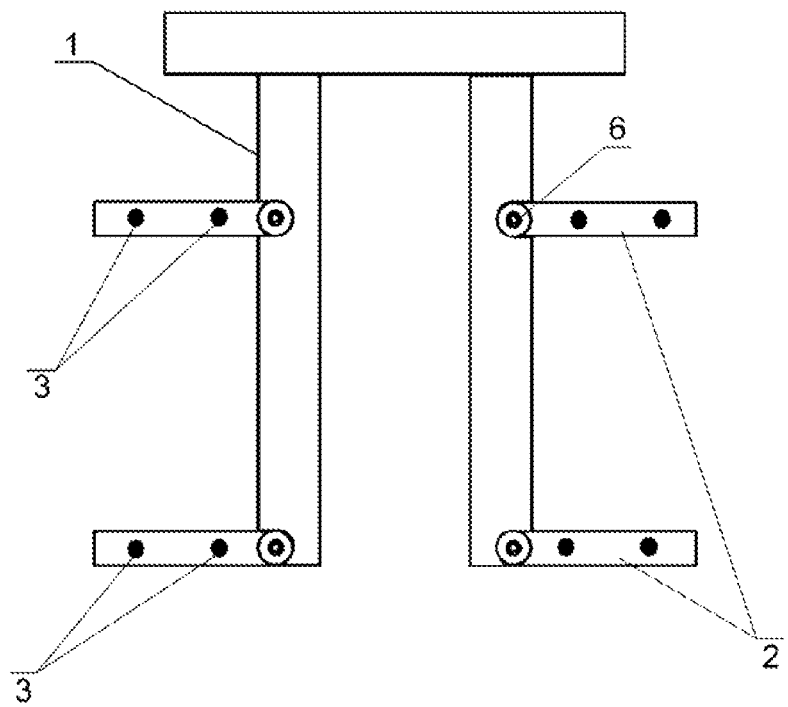
FIG. 3 is a top plan view showing the support arm of the liquid crystal panel transportation device according to the embodiment of the present invention in a condition where the ancillary arm sections are set in an expanded state.

Reference is made to FIGS. 1-3, the primary arm section 1 comprise at least two slender and elongate support bars that are parallel to each other. The two support bars have top surfaces 1a that are substantially coplanar. The number of support bars used is limited by the width of the rack 5 and all the support bars used shoulder render an overall width that is less than the width of the rack 5. The top surfaces 1a of the support bars are the contact surfaces that are in direct engagement with the liquid crystal panel during the process of transportation, whereby keeping these surface on the same horizontal plane would help maintaining relative stability between the liquid crystal panel and the support arm and prevent undesired sliding off.

The plurality of ancillary arm sections 2 is each in the form of a slat having an end connected to the middle and an end of each of the support bars. The opposite end of each of the plurality of ancillary arm sections 2 is rotatable in a direction toward the outer sides of the at least two support bars for opening and closing.

To practice, the ancillary arm sections 2 can be connected through hinging to the primary arm section 1 by means of for example, hexagon socket screws 6 respectively put through the ancillary arm sections 2 and the primary arm section 1 that are set in an expanded condition. Stowing the ancillary arm sections 2 on the primary arm section 1 can be done in two ways described as follows.

Embodiment 1

The support bars each form in side edges thereof cavities (not shown) for receiving the plurality of ancillary arm sections 2. These cavities are shaped to correspond to the ancillary arm sections 2 so as not to interfere with the rotation thereof. Since the cavities have a depth that corresponds to height of the ancillary arm sections 2, when the ancillary arm sections 2 are set in a closed state with respect to the primary arm section 1 by being received in the cavities, top surfaces 2a of the ancillary arm sections 2 are substantially on the same plane as the top surfaces 1a of the primary arm section 1. This arrangement provides the following effect. Forming receiving spaces in the primary arm section 1 to receive therein the ancillary arm sections 2 is advantageous in that the ancillary arm sections 2 can be stowed in transporting a small-sized liquid crystal panel so as to reduce the amount of volume occupied by the support arm. Further, setting the surfaces of the two support bars on the same horizontal plane is helpful for keeping flatness of the contact surface that is in direct engagement with the liquid crystal panel.

Embodiment 2

The ancillary arm sections 2, when in a closed state with respect to the primary arm section 1, are stacked on the top surfaces 1a of the support bars. The difference between this embodiment and the above described Embodiment 1 is that there is no need to form the cavities in the primary arm section 1 for receiving the ancillary arm sections 2. When the support arm carries a liquid crystal panel, since the top surfaces 2a of the ancillary arm sections 2 are higher than the height of the top surfaces 1a of the primary arm section 1. This makes the cross-section of the carried liquid crystal panel showing a wavy configuration with small amplitudes. Such a configuration helps controlling the deflections of the opposite edges of the liquid crystal panel, making it maintaining a relatively flat condition in the entirety thereof and preventing the panel from being damaged during the transportation thereof.

Further, the following details may be taken for the preferred one of the two embodiments.

The ancillary arm sections 2 are arranged symmetrically on the support bars. In other words, as shown in the drawings, two ancillary arm sections 2 that are provided on each of the two left and right support bars are arranged, in respect of shape and position, in a manner symmetric with respect to a central axis of the two support bars. This arrangement makes the ancillary arm sections 2 providing symmetric support when expanded, improving the stability of contact between the support arm and the liquid crystal panel.

Further, a plurality of suction nozzles 3 can be additionally mounted to the top surfaces of the ancillary arm sections 2. These suction nozzles 3 effect secured engagement with the liquid crystal panel when the liquid crystal panel is transported by the support arm so as to reduce adverse effect caused on the position of the liquid crystal panel by vibration of the transportation device during the transportation process.

Further, the ancillary arm sections 2 are rotatable with respect to the primary arm section 1 for opening to a maximum angle of 90°. This arrangement realizes maximized carrying area with the shortest length of the ancillary arm sections 2, allowing of reduction of cost.

The present invention also provides a liquid crystal panel transportation device. The transportation device uses the support arm thereof to move a liquid crystal panel 4 to a rack 5 that stores the liquid crystal panel. To practice, the liquid crystal panel transportation device is provided with the support arm structure included in the liquid crystal panel transportation device as described above. Repeated description will be omitted.

When the liquid crystal panel transportation device and the support arm thereof are put into practice, the transportation device is applicable to transportation of liquid crystal panels of various sizes. For example, to transport glass substrates above generation 4.5, the ancillary arm sections 2 are rotated about hinging axes toward outer sides of the two support arms by 90°. When the rotation reaches the final position, hexagon screws 6 are respectively put through the ancillary arm sections 2 that are in the expanded condition and the primary arm section 1 for fixation.

Afterwards, the support arm, as a whole, is inserted to the bottom of the liquid crystal panel to carry out lifting and transportation operations. During the transportation process, the suction nozzles 3 of the ancillary arm sections 2 may effect tight engagement with the liquid crystal panel 4.

The transportation device that comprises the ancillary arm sections 2 that are rotatable to open provides an enlarged carrying surface, making it possible to effectively control deflections of the opposite edges of the liquid crystal panel and effectively improve the yield rate of the liquid crystal panel to thereby increase throughput.

Further, in transporting a small-sized liquid crystal panel, the ancillary arm sections can be stowed as described above, so that there is no need to replace the support arm of the transportation device and the cost is reduced.

In other embodiments of the liquid crystal panel transportation device and the support arm structure thereof according to the present invention, the primary arm section is not limited to such a structure of two parallel support bars. Other numbers and connections can be applied according to the practical applications, provided that the primary arm section is provided with ancillary arm sections that are rotatable outward to open. The mounting locations and numbers of the ancillary arm sections can be embodied in different ways, such as the ancillary arm sections being mounted to the bottom surface of the primary arm section which also realizes the purpose of controlling deflections of the opposite edges of the liquid crystal panel.

The liquid crystal panel transportation device and the support arm structure thereof according to the present invention are arranged to provide a plurality of ancillary arm sections that is rotatable to open on a primary arm section so as to enlarge the carrying surface of the liquid crystal panel transportation device and effectively control the deflections of the opposite edge of the liquid crystal panel during the transportation of the liquid crystal panel thereby preventing edge breaking of the liquid crystal panel resulting from impact occurring between the liquid crystal panel and a rack and effectively improving the yield rate of the liquid crystal panel. The transportation device is applicable to the transportation of liquid crystal panels of various sizes without replacing the support arm so that the cost can be further reduced and the throughput can be further increased.

What is claimed is:

1. A support arm of liquid crystal panel transportation device, comprising: a primary arm section (1), and characterized in that the primary arm section (1) comprises a plurality of ancillary arm sections (2) that are mounted to the primary arm section by hexagonal socket screws so as to be rotatable with respect to the primary arm section between an open state where the ancillary arm sections extend outside the primary arm section and are fixed in position by tightening the hexagonal socket screws and a closed state;

wherein the primary arm section has flat sides having portions thereof that are recessed to form spaced cavities for respectively receiving the ancillary arm sections, the ancillary arm sections being respectively rotatable into the cavities in the closed state where top surfaces the ancillary arm sections are substantially on the same plane as a top surface of the primary arm section to form a flat contact surface adapted to have the top surfaces of the ancillary arm sections and the primary arm section in direct engagement with an object placed thereon; and wherein the ancillary arm sections extend out of the cavities in the open state in such a way that the top surfaces of the ancillary arm sections are maintained on the same plane as the top surface of the primary arm section, whereby the top surfaces of the ancillary arm sections maintain on the same plane as the top surface of the primary arm section during rotation thereof from the closed state to the open state.

2. The liquid crystal glass packaging device as claimed in claim 1, characterized in that the primary arm section (1) comprises at least two parallel support bars, the support bars having top surfaces that are on the same plane.

3. The liquid crystal glass packaging device as claimed in claim 2, characterized in that the plurality of ancillary arm sections (2) each have an end connected to the support bars, the plurality of ancillary arm sections (2) each having an opposite end that is rotatable toward an outer side of the at least two support bars for opening and closing.

4. The support arm of liquid crystal panel transportation device as claimed in claim 2, characterized in that the ancillary arm sections (2) are symmetrically arranged on the support bars.

5. The support arm of liquid crystal panel transportation device as claimed in claim 1, characterized in that the ancillary arm sections (2) have top surfaces on which suction nozzles (3) for tight engagement with the liquid crystal panel are mounted.

6. The support arm of liquid crystal panel transportation device as claimed in claim 1, characterized in that the ancillary arm sections (2) are rotatable with respect to the primary arm section (1) by a maximum angle of 90°.

7. A liquid crystal panel transportation device, characterized in that the liquid crystal panel transportation device comprises the support arm according to claim 1.

* * * * *